United States Patent
Chen (10) Patent No.: US 7,310,012 B2
(45) Date of Patent: Dec. 18, 2007

(54) VOLTAGE LEVEL SHIFTER APPARATUS

(75) Inventor: Chuen-Shiu Chen, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 11/407,442

(22) Filed: Apr. 19, 2006

(65) Prior Publication Data

US 2007/0247209 A1    Oct. 25, 2007

(51) Int. Cl.
*H03L 5/00* (2006.01)
(52) U.S. Cl. .......................... 327/333; 326/62; 326/63; 326/68; 326/80; 326/81
(58) Field of Classification Search ................ 327/319, 327/33, 333; 326/62, 63, 68, 80, 81
See application file for complete search history.

(56) References Cited

U.S. PATENT DOCUMENTS

| | | | |
|---|---|---|---|
| 6,650,168 B1 | 11/2003 | Wang et al. ................ | 327/306 |
| 6,700,407 B1 * | 3/2004 | Wert ........................... | 326/81 |
| 6,700,429 B2 * | 3/2004 | Kanno et al. ............... | 327/333 |
| 6,750,696 B2 * | 6/2004 | Shimada et al. ............ | 327/333 |
| 6,803,801 B2 | 10/2004 | Randazzo et al. .......... | 327/333 |
| 6,864,718 B2 * | 3/2005 | Yu .............................. | 326/68 |
| 6,924,689 B2 | 8/2005 | Randazzo et al. .......... | 327/333 |
| 7,176,740 B2 * | 2/2007 | Tachibana et al. .......... | 327/333 |

* cited by examiner

*Primary Examiner*—Tuan T. Lam
*Assistant Examiner*—Patrick O'Neill
(74) *Attorney, Agent, or Firm*—Winston Hsu (57) ABSTRACT

A voltage level shifter apparatus is provided. The voltage level shifter apparatus includes a first dynamic-bias generator, a second dynamic-bias generator, and a level supply circuit. The first dynamic-bias generator dynamically outputs a first bias signal, wherein the level of the first bias signal is determined in accordance with the received input data signal. The second dynamic-bias generator outputs a second bias signal, wherein the level of the second bias signal is determined in accordance with the received input data signal. Besides receiving the input data signal, the level supply circuit is further coupled to the first dynamic-bias generator and the second dynamic-bias generator for receiving the first bias signal and the second bias signal, and generating the output data signal in accordance with the input data signal, the first bias signal, and the second bias signal.

14 Claims, 5 Drawing Sheets

FIG. 8

VOLTAGE LEVEL SHIFTER APPARATUS

BACKGROUND OF THE INVENTION

1. Field of Invention

The present invention relates to a voltage level shifter apparatus. More particularly, the present invention relates to a voltage level shifter apparatus using dynamic-bias.

2. Description of Related Art

With the development of technology, and following the trend that current development of technical products is pursuing slightness, thinness, shortness, and small volume while providing increasingly stronger functionality, the power used by inner circuits of technical products has been reduced accordingly; furthermore, the quantity and variety of adopted circuits and integrated circuit chips have become greater than ever, so ultra low voltage level in circuits or integrated circuit chips often need to be shifted to higher voltage level for the applications of the advanced technologies. A voltage level shift circuit is an apparatus used for providing the necessary voltage level shift.

Figure 1:
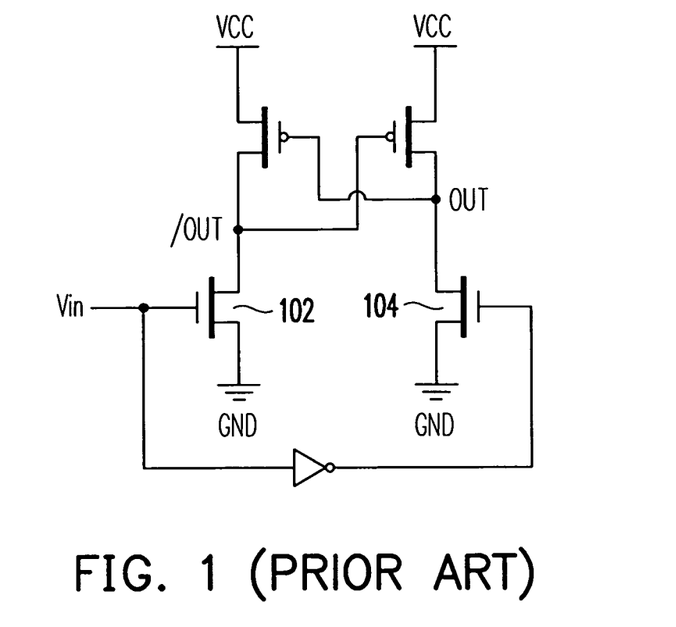
FIGS. 1, 2, 3, and 4 show conventional voltage level shift circuits.

FIG. 1 shows a conventional voltage level shift circuit. Referring to FIG. 1, transistors 102 and 104 are transistor elements adopting thick oxide, which therefore may be properly driven by an input signal Vin with a larger value. However, since the input signal Vin is often provided from the inside of the integrated circuit chip and the level thereof becomes lower with the progress of integrated circuit processes. If transistors 102 and 104 adopt transistor elements using thick oxide, the case that the transistors 102 and 104 are incapable of being properly driven by the input signal Vin might arise, and thereby two output ends OUT and /OUT of the voltage level generator cannot generate an output signal and an inversion output signal properly. However, if the transistors 102 and 104 are changed to adopt transistor elements of thin oxide for the sake of receiving a low input signal, the transistor 102 is likely to be damaged due to a voltage, between the output end /OUT and a ground voltage GND, which exceeds the voltage that the transistor 102 itself can endure; similarly, the transistor 104 may also be damaged due to a voltage, between the output end OUT and the ground voltage GND, which exceeds the voltage that the transistor 104 itself can endure. And thus, the output of the voltage level shift circuit becomes very unstable and therefore such a method is not suitable. To eliminate the above-mentioned defect, a circuit as shown in FIG. 2 was developed.

Figure 2:
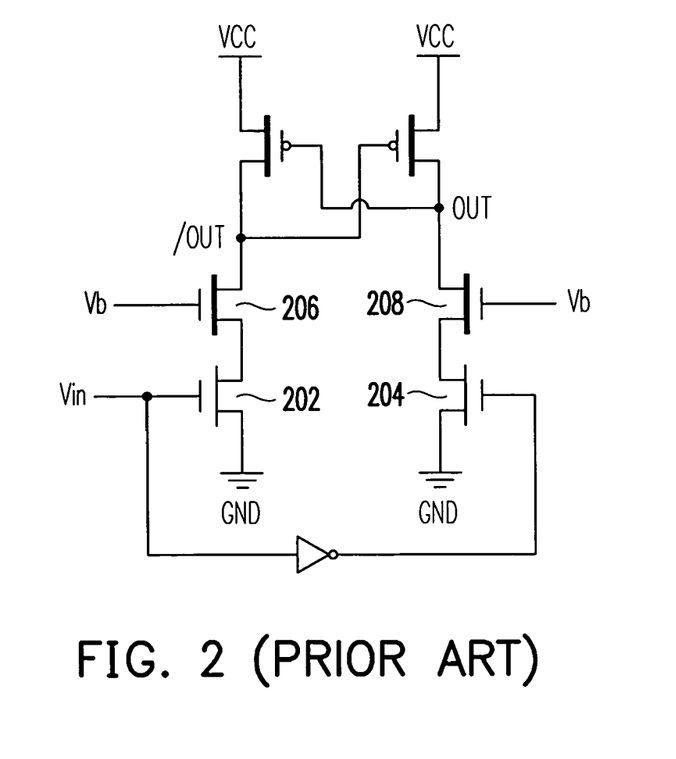

FIG. 2 shows a conventional voltage level shift circuit. Referring to FIG. 2, differences between FIG. 1 and FIG. 2 lie in that in FIG. 2 the input transistors are changed to adopt transistor elements of thin oxide (i.e. transistors 202 and 204 as shown in FIG. 2 respectively), and a native transistor 206 is additionally series-connected between the output end /OUT and the transistor 202, and a native transistor 208 is also additionally series-connected between the output end OUT and the transistor 204. U.S. Pat. No. 6,650,168 and U.S. Pat. No. 6,803,801, which are conventional technologies adopting such a technique, both adopt native transistors in the voltage level shift circuits published therein.

Further, some additional conventional technologies replace the above native transistors with general transistors, for example, U.S. Pat. No. 6,700,407 and U.S. Pat. No. 6,924,689, etc. In these conventional technologies, fixed-level bias signals (e.g., Vb in FIG. 2) are typically needed for biasing the transistors (e.g., the transistors 206 and 208 in FIG. 2), such that the voltage across the input transistors will not be excessively high.

Figure 3:
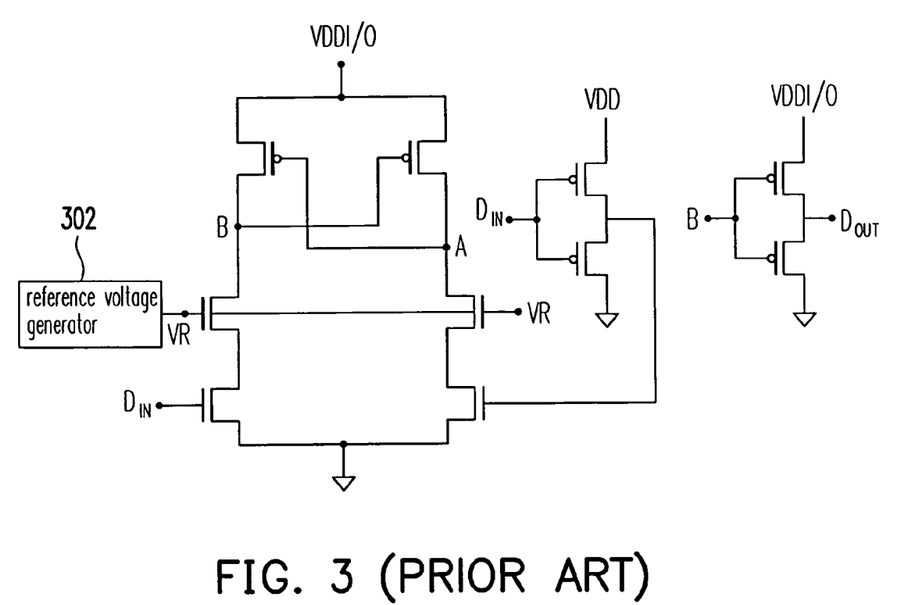

FIG. 3 shows a conventional voltage level shift circuit. Referring to FIG. 3, the figure illustrates U.S. Pat. No. 6,700,407 filed by the Japanese National Corporation. It can be clearly seen from the drawing that this conventional technology provides a bias signal VR having a fixed level by using a reference voltage generator 302. Since the fixed bias signal maintains the transistor in a biased state, a certain degree of stand-by leakage will be generated, which consumes more electric energy.

Figure 4:
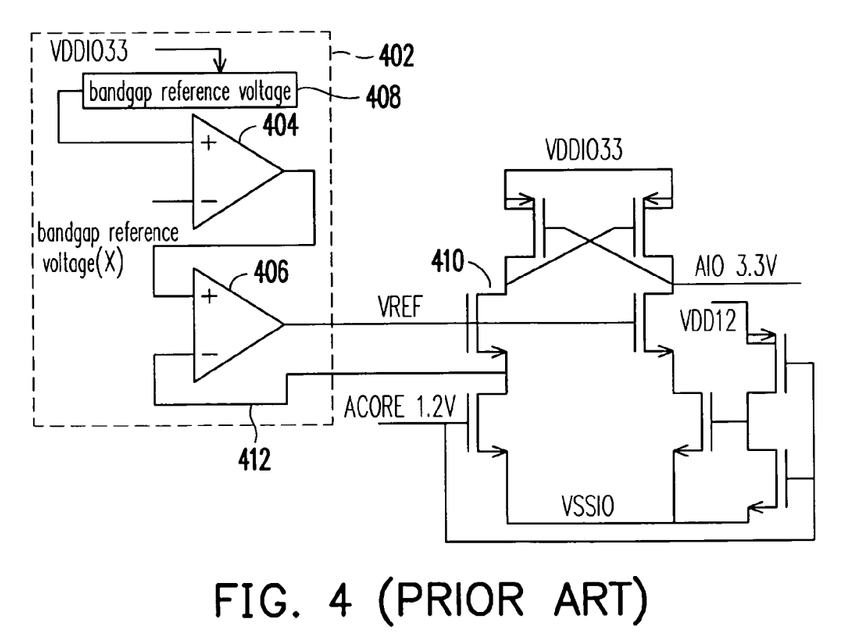

FIG. 4 shows a conventional voltage level shift circuit. Referring to FIG. 4, which shows U.S. Pat. No. 6,924,689 disclosed by LSI Corporation, it can be clearly seen from the drawing that a circuit block 402 shown therein is adopted also for generating the above bias signal, and operational amplifiers (OPAMPs) 404 and 406 are used in the circuit block 402 for comparing signals in order to obtain a more precise bias signal. However, a bandgap reference voltage 408 must be further provided at a positive input end of the OPAMP 404, therefore, those who desire to adopt this circuit have to further provide a circuit for generating the bandgap reference voltage. Moreover, since a bias signal also needs to be additionally provided for the OPAMPs 404 and 406 themselves for an operation, a leakage phenomenon will occur.

Additionally, since a negative input end of the OPAMP 406 is still coupled to one of the source/drain ends of the transistor 410 (a feedback path as shown by 412) to form a feedback, although this circuit block 402 provides a precise bias signal, the whole operating speed is lowered due to the use of feedback. Furthermore, such a bias signal is still a fixed-type one and therefore still generates stand-by leakage such that more electric energy will be consumed.

Therefore, in the conventional technologies as described above, since only the fixed bias signal may be provided, the transistor for receiving the bias signal will always be presented in a biased on state and generate the leakage, and thereby more power will be consumed and more heat energy will be generated. Thus, all technical products which apply a voltage level shift circuit are negatively influenced.

SUMMARY OF THE INVENTION

An object of the present invention is to provide a dynamic-bias voltage level shifter apparatus without the extra current leakage from the bias circuit.

To achieve the above and other objects, the present invention proposes a voltage level shifter apparatus, which includes a first dynamic-bias generator, a second dynamic-bias generator, and a level supply circuit. The first and the second dynamic-bias generators dynamically output a first and a second bias signals respectively, wherein the level of the first and second bias signals are determined in accordance with the in-phase received input data signal and its inverse one. Besides receiving the input data signal, the level supply circuit is further coupled to the first and the second dynamic-bias generators for receiving those two bias signals and generating the output data signals. Bias signals of the first and the second dynamic-bias generators are complementary.

In the present invention, the desired level of the bias signal in the voltage level shifter apparatus is dynamically determined according to the input data signal, thus the extra current leakage from the bias generators can be eliminated and power consumption is thereby saved. Additionally, in the present invention, no OPAMP and feedback path are needed, thus no additional leakage caused by the OPAMP will exist, and the performance of the voltage level shifter apparatus will not be influenced due to the waiting for a feedback.

In order to make the aforementioned and other objects, features and advantages of the present invention comprehensible, a preferred embodiment accompanied with figures are described in detail below.

It is to be understood that both the foregoing general description and the following detailed description are exemplary, and are intended to provide further explanation of the present invention as claimed.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 5:
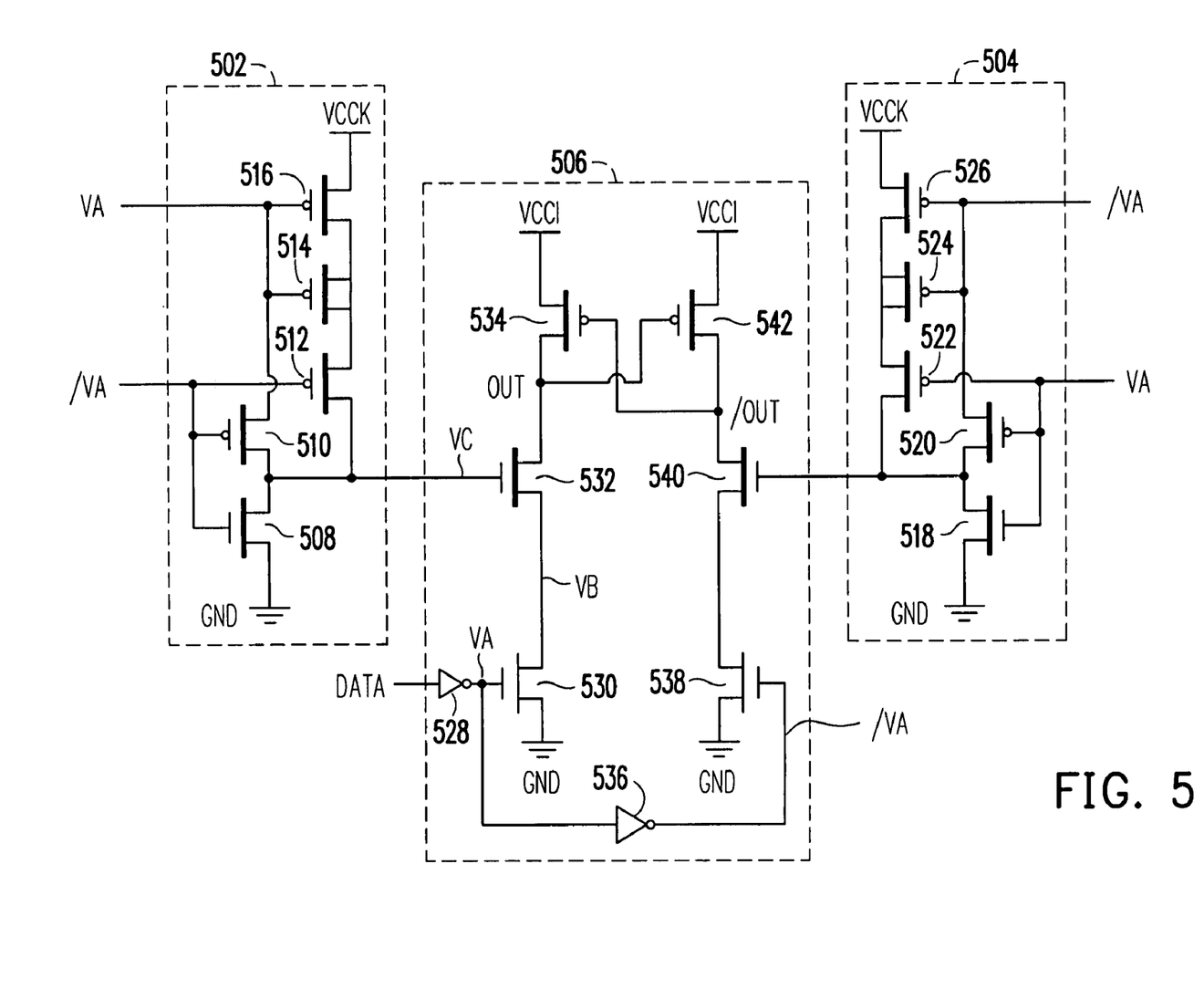
FIG. 5 shows a voltage level shifter apparatus according to a preferred embodiment of the present invention.
Figure 6:
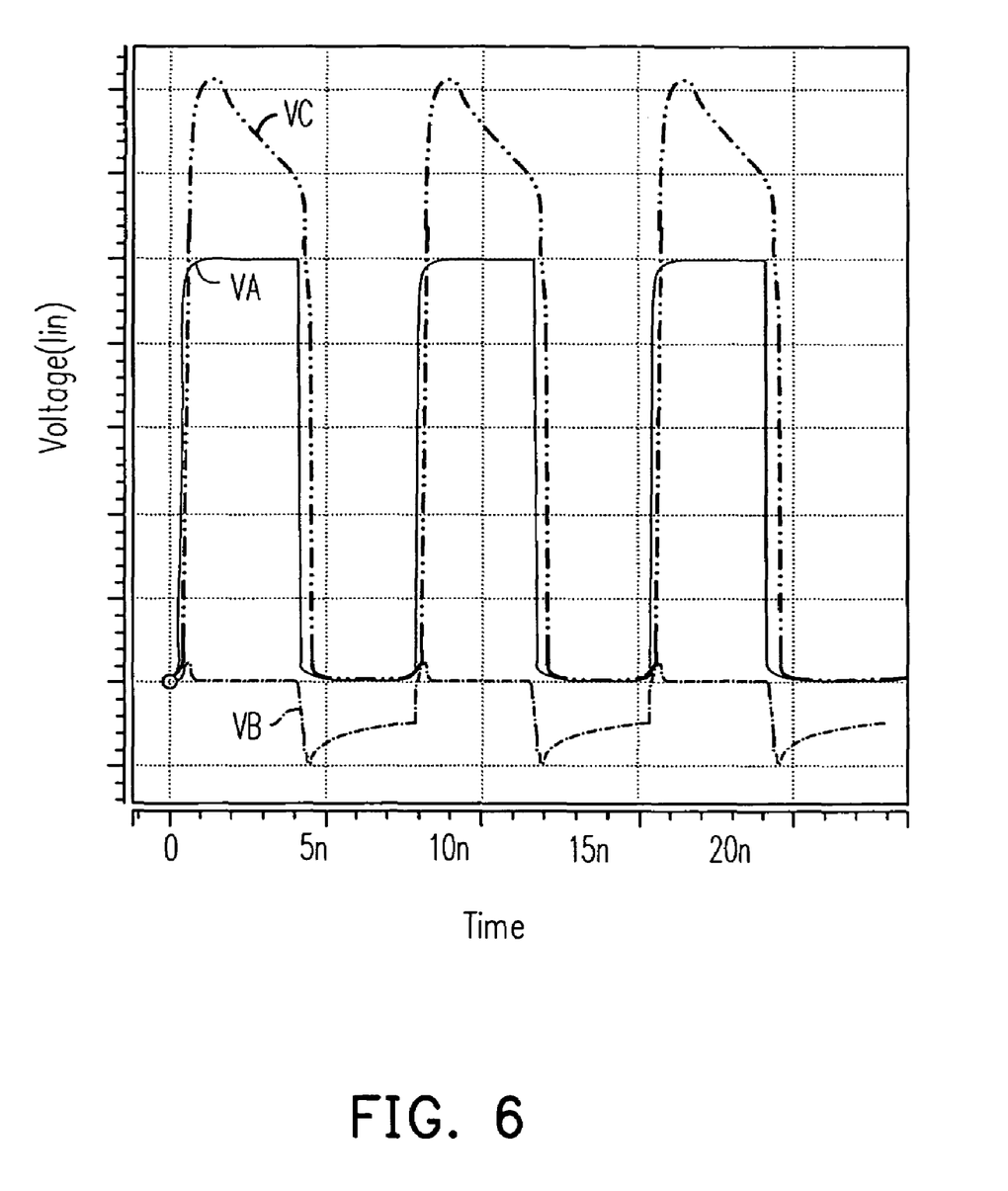
FIG. 6 shows a signal measurement diagram of a preferred embodiment of the present invention.

FIG. 5 shows a voltage level shifter apparatus according to a preferred embodiment of the present invention. FIG. 6 is a diagram of signal measurement in the voltage level shifter apparatus of FIG. 5. Referring to FIGS. 5 and 6 at the same time, the voltage level shifter apparatus includes a first dynamic-bias generator 502, a second dynamic-bias generator 504, and a level supply circuit 506. The first dynamic-bias generator 502 and the second dynamic-bias generator 504 respectively generate a first bias signal and a second bias signal using an inversion input data signal VA in addition to an in-phase signal /VA of the input data signal DATA. With the inverter 528 in the level supply circuit 506, VA is generated from the input signal DATA as its inversion signal. In addition, /VA is an inversion of VA through the inverter 536 of the level supply circuit 506. Furthermore, /VA is an in-phase signal of DATA.

Continue to refer to FIG. 5, the first dynamic-bias generator 502 and the second dynamic-bias generator 504 are used to output the first and the second bias signals respectively, wherein the dynamic-bias generators 502 and 504 further receive the signal VA and /VA, and dynamically determine the level of the first and the second bias signals according to the received signal VA and /VA. Besides receiving the input data signal DATA, the level supply circuit 506 is further coupled to the first dynamic-bias generator 502 and the second dynamic-bias generator 504 for receiving the first bias signal and the second bias signal, and then generating the output data signal OUT.

The above-mentioned first dynamic-bias generator 502 includes a first transistor 508, a second transistor 510, a third transistor 512, a first capacitor 514, and a fourth transistor 516. In this embodiment, the first transistor 508 is an N-type transistor, the second transistor 510, the third transistor 512, and the fourth transistor 516 are P-type transistors, and furthermore, the first transistor 508, the second transistor 510, the third transistor 512, and the fourth transistor 516 are transistor elements of thick oxide.

Gate ends of the transistors 508, 510, and 512 receive the signal /VA, while the source end of the first transistor 508 is coupled to the ground voltage GND. The drain end of the second transistor 510 is coupled to the drain end of the first transistor 508, while the source end of the second transistor 510 receives the signal VA. The drain end of the third transistor 512 is coupled to a place where the second transistor 510 and the first transistor 508 are coupled with each other, and provides the first bias signal at this place.

In the present embodiment, the first capacitor 514 is implemented by using a P-type transistor. That is, the gate of the P-type transistor is considered as one end of the capacitor, while the drain and the source connected with each other in the P-type transistor is considered as the other end of the capacitor, wherein this P-type transistor is a transistor element of thick oxide. One end of the first capacitor 514 receives the signal VA, while the other end of the first capacitor 514 is coupled to the source end of the transistor 512. The gate end of the fourth transistor 516 receives the signal VA, the drain end of the fourth transistor 516 is coupled to the source end of the third transistor 512, and the source end of the fourth transistor 516 is coupled to a first preset potential a core supply voltage VCCK here. In the present embodiment, assuming that the core supply voltage VCCK is 1V. In addition, N-well of PMOS transistors 510, 512, 514 (as the first capacitor) and 516 are coupled to source end of the transistor 512 instead of VCCK.

Assuming that the signal /VA is at a high potential (i.e., the signal VA is at a low potential), at this time, the first transistor 508 and the second transistor 510 respectively present an on-state and an off-state as having received the signal /VA, thus the first bias signal output from the first dynamic-bias generator 502 presents a low potential. Meanwhile, the third transistor 512 and the fourth transistor 516 also respectively present an off-state and an on-state as having respectively received the signal /VA and the signal VA, such that the first capacitor 514 is connected between the signal VA and the core supply voltage VCCK, and therefore a potential VCCK is stored between the two ends of the first capacitor 514.

Assuming that the signal /VA is changed from the high potential to the low potential (i.e., the signal VA is converted from the low potential to the high potential). At this time, the first transistor 508 and the second transistor 510 respectively present an off-state and an on-state as having received the signal /VA, and therefore a place where the first transistor 508 and the second transistor 510 are coupled with each other presents a potential approximate to that of the signal VA. Meantime, the third transistor 512 also presents an on-state as having received the signal /VA, while the fourth transistor 516 presents an off-state as having received the signal VA, and therefore the first capacitor 514 raises the potential of the first bias signal VC output from the first dynamic-bias generator 502 by using the previously stored charges.

The second dynamic-bias generator 504 described in FIG. 5 includes a fifth transistor 518, a sixth transistor 520, a seventh transistor 522, a second capacitor 524, and an eighth transistor 526. The fifth transistor 518 is an N-type transistor, while the sixth transistor 520, the seventh transistor 522, and the eighth transistor 526 are P-type transistors, and moreover the fifth transistor 518, the sixth transistor 520, the seventh transistor 522, and the eighth transistor 526 are transistor elements of thick oxide.

The gate end of the fifth transistor 518 receives the signal VA, while the source end of the fifth transistor 518 is coupled to the ground voltage GND. The gate end of the sixth transistor 520 is coupled to the gate end of the fifth transistor 518, the drain end of the sixth transistor 520 is coupled to the drain end of the fifth transistor 518, and the source end of the sixth transistor 520 receives the signal /VA. The gate end of the seventh transistor 522 is coupled to the gate end of the sixth transistor 520, while the drain end of the seventh transistor 522 is coupled to a place where the sixth transistor 520 and the fifth transistor 518 are coupled with each other, and provides the second bias signal at this place.

In the present embodiment, the second capacitor 524 is implemented by using a P-type transistor. That is, the gate of the P-type transistor is considered as one end of the capacitor, while the drain and the source connected with each other in the P-type transistor is considered as the other end of the capacitor, wherein this P-type transistor is a transistor element of thick oxide. One end of the second capacitor 524 receives the signal /VA, while the other end of the second capacitor 524 is coupled to the source end of the seventh transistor 522. The gate end of the eighth transistor 526 receives the signal /VA, the drain end of the eighth transistor 526 is coupled to the source end of the seventh transistor 522, and the source end of the eighth transistor 526 is coupled to the core supply voltage VCCK. Identically, N-well of PMOS transistors 520, 522, 524 (as the second capacitor) and 526 are coupled to source end of the transistor 522 instead of VCCK.

Assuming that the signal /VA is at a low potential (i.e., the signal VA is at a high potential). At this time, the fifth transistor 518 and the sixth transistor 520 respectively present an on-state and an off-state as having received the signal VA, and therefore the second bias signal output from the second dynamic-bias generator 504 presents the low potential. Meanwhile, the seventh transistor 522 and the eighth transistor 526 also respectively present an off-state and an on-state as having respectively received the signal VA and /VA, such that the second capacitor 524 is connected between the signal /VA and the core supply voltage VCCK, and therefore a potential VCCK is stored between the two ends of the second capacitor 524.

Assuming that the signal /VA is changed from the low potential to the high potential (i.e., the signal VA is converted from the high potential to the low potential). At this time, the fifth transistor 518 and the sixth transistor 520 respectively present an off-state and an on-state as having received the signal VA, and therefore a place where the fifth transistor 518 and the sixth transistor 520 are coupled with each other presents a potential approximate to that of the signal /VA. In the meantime, the seventh transistor 522 also presents an on-state as having received the signal VA, while the eighth transistor 526 presents an off-state as having received the signal /VA, and therefore the second capacitor 524 raises the potential of the second bias signal output from the second dynamic-bias generator 504 by using the previously stored charges.

The level supply circuit 506 described in FIG. 5 includes a first inverter 528, a ninth transistor 530, a tenth transistor 532, an eleventh transistor 534, a second inverter 536, a twelfth transistor 538, a thirteenth transistor 540, and a fourteenth transistor 542. The ninth transistor 530, the tenth transistor 532, the twelfth transistor 538, and the thirteenth transistor 540 are N-type transistors, while the eleventh transistor 534 and the fourteenth transistor 542 are P-type transistors. In the above transistors, the tenth transistor 532, the eleventh transistor 534, the thirteenth transistor 540, and the fourteenth transistor 542 are further transistor elements of thick oxide, while the ninth transistor 530 and the twelfth transistor 538 are transistor elements of thin oxide.

The first inverter 528 of FIG. 5 receives the input data signal DATA, while the gate end of the ninth transistor 530 receives an output voltage VA of the first inverter 528, and the source end of the ninth transistor 530 is coupled to the ground voltage GND. The gate end of the tenth transistor 532 receives the first bias signal, while the source end of the tenth transistor 532 is coupled to the drain end of the ninth transistor 530. The drain end of the eleventh transistor 534 is coupled to the drain end of the tenth transistor 532, while the source end of the eleventh transistor 534 is coupled to a second preset potential (an input/output supply voltage VCCI here). The second inverter 536 receives the output of the first inverter 528, while the gate end of the twelfth transistor 538 receives the output signal /VA of the second inverter 536, and the source end of the twelfth transistor 538 is coupled to the ground voltage GND. The gate end of the thirteenth transistor 540 is coupled to the drain end of the twelfth transistor 538. The gate end of the fourteenth transistor 542 is coupled to a place where the tenth transistor 532 and the eleventh transistor 534 are coupled with each other, and provides the output data signal OUT at this place. The drain end of the fourteenth transistor 542 is coupled to the drain end of the thirteenth transistor 540 and the gate end of the eleventh transistor 534, and provides an inversion output data signal /OUT at a place where the fourteenth transistor 542 and the thirteenth transistor 540 are coupled with each other, while the source end of the fourteenth transistor 542 is coupled to the input/output supply voltage VCCI.

Assuming that the state of the input data signal DATA is the high potential, then the first bias signal will present the low potential, while the second bias signal will present the high potential. At this time, the ninth transistor 530 and the tenth transistor 532 both present an off-state as having respectively received the inversion input data signal /DATA (i.e., the voltage VA) output from the first inverter 528 and the first bias signal (i.e., the voltage VC). The twelfth transistor 538 and the thirteenth transistor 540 both present an on-state as having respectively received the signal /VA output from the second inverter 536 and the second bias signal, such that the inversion output data signal /OUT presents the potential of the ground voltage GND (i.e., the low potential), thereby facilitating the eleventh transistor 534 to be turned on such that the output data signal OUT presents the potential of the input/output supply voltage VCCI (i.e., the high potential). Being a transistor element of thick oxide, the tenth transistor 532 may bear a majority of the voltage between the output data signal OUT and the ground voltage GND, such that the ninth transistor 530 adopting a transistor element of thin oxide will not suffer damage resulting from an undue voltage VB beneath its maximum endurable voltage.

Assuming that the state of the input data signal DATA is the low potential, then the first bias signal will present the high potential, while the second bias signal will present the low potential. At this time, the twelfth transistor 538 and the thirteenth transistor 540 both present an off-state as having respectively received the signal /VA and the second dynamic-bias signal, while the ninth transistor 530 and the tenth transistor 532 both present an on-state as having respectively received the inversion of the input data signal DATA (i.e., the voltage VA) inverted by the first inverter 528 and the first bias signal (i.e., the voltage VC), such that the output data signal OUT presents the potential of the ground voltage GND (i.e., the low potential), thereby facilitating the fourteenth transistor 542 to be turned on such that the inversion output data signal /OUT presents the potential of the input/output supply voltage VCCI (i.e., the high potential). Being a transistor element of thick oxide, the thirteenth transistor 540 may bear a majority of the voltage between the output data signal OUT and the ground voltage GND, such that the twelfth transistor 538 adopting a transistor element of thin oxide will not suffer damage resulting from an undue voltage beneath its maximum endurable voltage.

The above-mentioned tenth transistor 532 and thirteenth transistor 540 may be native transistors as well as general transistors or transistors of other types.

Figure 7:
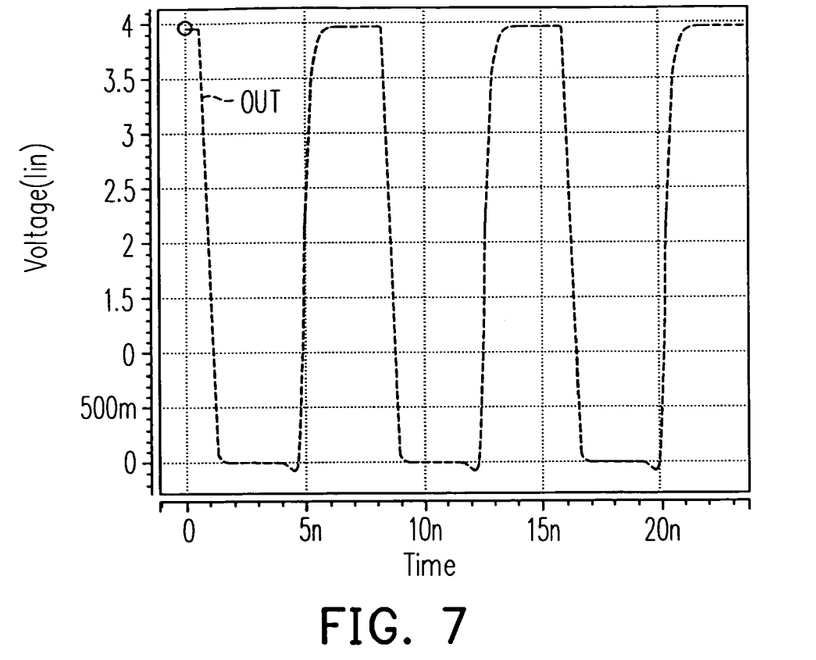
FIG. 7 shows a diagram of an output wave form under the worst condition.
Figure 8:
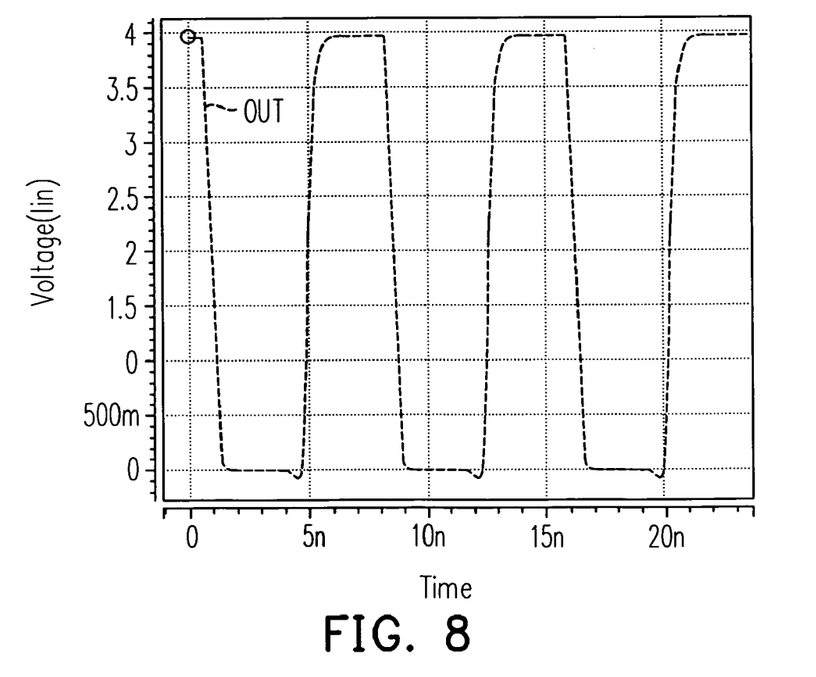
FIG. 8 shows a diagram of an output wave form under the most ideal condition.

To illustrate the reliability of the voltage level shifter apparatus of the present invention, FIG. 7 is cited below to explain an output wave form of the shifter apparatus of the present invention under a harsh condition; and additionally, FIG. 8 is further cited to explain an output wave form of the shifter apparatus of the present invention under the most ideal condition.

FIG. 7 shows a diagram of the output waveform of the voltage level shifter apparatus in FIG. 5. The above-mentioned harsh condition refers to that the P-type transistors and the N-type transistors in the voltage level shifter apparatus both adopt slow transistors, and the voltage level shifter apparatus is operated under a low temperature of minus 40 degrees. FIG. 8 shows a diagram of the output wave form of the voltage level shifter apparatus in FIG. 5 under the most ideal condition. Referring to FIGS. 5 and 8 together, the above-mentioned best condition refers to that the P-type transistors in the voltage level shifter apparatus adopt fast transistors, while the N-type transistors adopt low transistors, and the voltage level shifter apparatus is operated under a high temperature of 125 degrees. If the core supply voltage VCCK is 0.8 volts and the input/output supply voltage VCCI is 3.96 volts, it can be seen from FIGS. 7 and 8 that when the input data signal DATA of the voltage level shifter apparatus in FIG. 5 is at a high level, the output data signal OUT presents a voltage of about 3.96 volts. Thus, the voltage level shifter apparatus of the present invention has a reliability of a considerable extent.

In the present invention, because only one input data signal is adopted in the voltage level shifter apparatus, and the level of the bias signal required in the apparatus is dynamically determined in accordance with such an input data signal, and then the voltage level shifter apparatus generates the output data signal in accordance with the input data signal and the generated bias signals, an effect the same as that of the conventional circuit can be achieved without using additional bias signals in the present invention.

It will be apparent to those skilled in the art that various modifications and variations can be made to the structure of the present invention without departing from the scope or spirit of the present invention. In view of the foregoing, it is intended that the present invention cover modifications and variations of this invention provided they fall within the scope of the following claims and their equivalents.

What is claimed is:

1. A voltage level shifter apparatus for receiving an input data signal and outputting an output data signal with different levels accordingly, comprising:

a first dynamic-bias generator for outputting a first bias signal, herein the first dynamic-bias generator further dynamically determines a level of the first bias signal in accordance with an in-phase signal of the input data signal and an out-of-phase signal of the input data signal, including:

a first transistor, having its gate end receive the in-phase signal of the input data signal, and its first source/drain end grounded;

a second transistor, having its gate end coupled to the gate end of the first transistor, its first source/drain end coupled to the second source/drain end of the first transistor, and its second source/drain end receive the out-of-phase signal of the input data signal;

a third transistor, having its gate end coupled to the gate end of the second transistor, and its first source/drain end coupled to the first source/drain end of the second transistor, wherein the first source/drain end of the third transistor provides the first bias signal;

a first capacitor, having its first end receive the out-of-phase signal of the input data signal and coupled to the second source/drain end of the second transistor, and its second end coupled to the second source/drain end of the third transistor; and a fourth transistor, having its gate end coupled to the first end of the first capacitor, its first source/drain end coupled to the second end of the capacitor, and its second source/drain end coupled to a first preset potential;

wherein the doping type of the first transistor is different from that of the second transistor, the third transistor, and the fourth transistor;

a second dynamic-bias generator for outputting a second bias signal, wherein the second dynamic-bias generator further dynamically determines a level of the second bias signal in accordance with the in-phase signal of the input data signal and the out-of-phase signal of the input data signal; and a level supply circuit coupled to the first dynamic-bias generator and the second dynamic-bias generator, for receiving the input data signal and generating the output data signal in accordance with the first bias signal and the second bias signal.

2. The voltage level shifter apparatus as claimed in claim 1, further comprising:

an NOT gate for outputting the out-of-phase signal of the input data signal by inverting the input data signal.

3. The voltage level shifter apparatus as claimed in claim 2, wherein the second dynamic-bias generator includes:

a fifth transistor, having its gate end receive the out-of-phase signal of the input data signal, and its first source/drain end grounded;

a sixth transistor, having its gate end coupled to the gate end of the fifth transistor, its first source/drain end coupled to the second source/drain end of the fifth transistor, and its second source/drain end receive the in-phase signal of the input data signal;

a seventh transistor, having its gate end coupled to the gate end of the sixth transistor, its first source/drain end thereof being coupled to the first source/drain end of the sixth transistor, wherein the first source/drain end of the seventh transistor provides the second bias signal;

a second capacitor, having its first end receive the in-phase signal of the input data signal and coupled to the second source/drain end of the sixth transistor, and its second end coupled to the second source/drain end of the seventh transistor; and an eighth transistor, having its gate end coupled to the first end of the second capacitor, its first source/drain end coupled to the second end of the second capacitor, and its second source/drain end coupled to a first preset potential;

wherein the doping type of the fifth transistor is different from that of the sixth transistor, the seventh transistor, and the eighth transistor.

4. The voltage level shifter apparatus as claimed in claim 3, wherein the fifth transistor is an N-type transistor, while the sixth transistor, the seventh transistor, and the eighth transistor are P-type transistors.

5. The voltage level shifter apparatus as claimed in claim 4, wherein the fifth transistor, the sixth transistor, the seventh transistor, and the eighth transistor are transistors of thick oxide.

6. The voltage level shifter apparatus as claimed in claim 3, wherein the first preset potential is a core supply voltage.

7. The voltage level shifter apparatus as claimed in claim 1, wherein the first capacitor is a P-type transistor, and the gate of the P-type transistor is one end of the capacitor, while the drain and the source of the P-type transistor are connected with each other as the other end of the capacitor.

8. The voltage level shifter apparatus as claimed in claim 1, wherein the first transistor is an N-type transistor, while the second transistor, the third transistor, and the fourth transistor are P-type transistors.

9. The voltage level shifter apparatus as claimed in claim 8, wherein the first transistor, the second transistor, the third transistor, and the fourth transistor are transistors of thick oxide.

10. The voltage level shifter apparatus as claimed in claim 1, wherein the first preset potential is a core supply voltage.

11. The voltage level shifter apparatus as claimed in claim 1, wherein the level supply circuit includes:
    a first inverter, having its input receive the input data signal;
    a ninth transistor, having its gate end coupled to the output of the first inverter, and its first source/drain end grounded;
    a tenth transistor, having its gate end receive the first bias signal, and its first source/drain end coupled to the second source/drain end of the ninth transistor, wherein the second source/drain end of the tenth transistor outputs the output data signal;
    an eleventh transistor, having its first source/drain end coupled to the second source/drain end of the tenth transistor, and its second source/drain end coupled to a second preset potential;
    a second inverter, having its input coupled to the output of the first inverter;
    a twelfth transistor, having its gate end coupled to the output of the second inverter, and its first source/drain end grounded;
    a thirteenth transistor, having its gate end receive the second bias signal, and its first source/drain end coupled to the second source/drain end of the twelfth transistor, wherein the second source/drain end of the thirteenth transistor outputs an inversion output data signal; and
    a fourteenth transistor, having its gate end coupled to the second source/drain end of the tenth transistor, its first source/drain end coupled to the second source/drain end of the thirteenth transistor and the gate end of the eleventh transistor, and its second source/drain end coupled to the second preset potential;
    wherein the doping type of the eleventh transistor and the fourteenth transistor is different from that of the ninth transistor, the tenth transistor, the twelfth transistor, and the thirteenth transistor.

12. The voltage level shifter apparatus as claimed in claim 11, wherein the ninth transistor, the tenth transistor, the twelfth transistor, and the thirteenth transistor are N-type transistors, while the eleventh transistor and the fourteenth transistor are P-type transistors.

13. The voltage level shifter apparatus as claimed in claim 12, wherein the tenth transistor, the eleventh transistor, the thirteenth transistor, and the fourteenth transistor are transistors of thick oxide, and the ninth transistor and the twelfth transistor are transistors of thin oxide.

14. The voltage level shifter apparatus as claimed in claim 11, wherein the second preset potential is an input/output supply voltage.

\* \* \* \* \*